(12) United States Patent
Jang et al.

(10) Patent No.: US 6,365,523 B1
(45) Date of Patent: Apr. 2, 2002

(54) INTEGRATED HIGH DENSITY PLASMA CHEMICAL VAPOR DEPOSITION (HDP-CVD) METHOD AND CHEMICAL MECHANICAL POLISH (CMP) PLANARIZING METHOD FOR FORMING PATTERNED PLANARIZED APERTURE FILL LAYERS

(75) Inventors: Syun-Ming Jang, Hsin-Chu; Chu-Yun Fu; Ying-Ho Chen, both of Taipei, all of (TW)

(73) Assignee: Taiwan Semiconductor Maufacturing Company, Hsin-Chu (TW)

( * ) Notice: Subject to any disclaimer, the term of this patent is extended or adjusted under 35 U.S.C. 154(b) by 0 days.

(21) Appl. No.: 09/177,188

(22) Filed: Oct. 22, 1998

(51) Int. Cl.$^7$ ............................................. H01L 21/302
(52) U.S. Cl. ...................... 438/692; 438/692; 438/693; 438/697; 438/700; 438/760
(58) Field of Search ................................ 438/424, 697, 438/760, 692, 693, 700

(56) References Cited

U.S. PATENT DOCUMENTS

| | | | | |
|---|---|---|---|---|
| 4,954,459 A | * | 9/1990 | Avanzino et al. | 437/228 |
| 5,182,221 A | * | 1/1993 | Sato | 437/67 |
| 5,212,114 A | * | 5/1993 | Grewal et al. | 437/192 |
| 5,492,858 A | * | 2/1996 | Base et al. | 437/67 |
| 5,494,854 A | * | 2/1996 | Jain | 437/195 |
| 5,498,565 A | * | 3/1996 | Gocho et al. | 437/67 |
| 5,721,172 A | * | 2/1998 | Jang et al. | 438/424 |
| 5,916,453 A | * | 6/1999 | Beilin et al. | 216/38 |

OTHER PUBLICATIONS

Nag et al. "Comparative Evaluation of Gap–Fill Dielectrics in Shallow Trench Isolation fr Sub–0.25 um Technologies", IEDM 96 IEEE.*

S. Nag. "Comparative Evaluation of Gap–Fill Dielectrics in Shallow Trench Isolation For Sub–0.25un Technolgies", IEDM 96 IEEE, pp. 841–44.

* cited by examiner

Primary Examiner—Felisa Hiteshew
Assistant Examiner—Charlotte A. Brown
(74) Attorney, Agent, or Firm—George O. Saile; Stephen B. Ackerman; Stephen G. Stanton

(57) ABSTRACT

A method for forming a series of patterned planarized aperture fill layers within a series of apertures within a topographic substrate layer employed within a microelectronics fabrication. There is first provided a topographic substrate layer employed within a microelectronics fabrication, where the topographic substrate layer comprises a series of mesas of substantially equivalent height but of differing widths and the series of mesas is separated by a series of apertures. There is then formed upon the topographic substrate layer a blanket first aperture fill layer. The blanket first aperture fill layer is formed employing a first simultaneous deposition and sputter method. The blanket first aperture fill layer fills the series of apertures to a planarizing thickness at least as high as the height of the mesas while simultaneously forming a series of protrusions of the blanket first aperture fill layer corresponding with the series of mesas, where the thickness of a protrusion of the blanket first aperture fill layer over a narrow mesa is less than the thickness of a protrusion of the blanket first aperture fill layer over a wide mesa. The first simultaneous deposition and sputter method employs a first deposition rate:sputter rate ratio which provides sufficient thickness of the blanket first aperture fill layer over the narrow mesa such that upon chemical mechanical polish (CMP) planarizing the blanket first aperture fill layer to form a series of patterned planarized first aperture fill layers within the series of apertures erosion of the narrow mesa is attenuated. Finally, there is then chemical mechanical polish (CMP) planarized the blanket first aperture fill layer to form the series of patterned planarized first aperture fill layers within the series of apertures.

24 Claims, 7 Drawing Sheets

INTEGRATED HIGH DENSITY PLASMA CHEMICAL VAPOR DEPOSITION (HDP-CVD) METHOD AND CHEMICAL MECHANICAL POLISH (CMP) PLANARIZING METHOD FOR FORMING PATTERNED PLANARIZED APERTURE FILL LAYERS

BACKGROUND OF THE INVENTION

1. Field of the Invention

The present invention relates generally to methods for forming patterned planarized aperture fill layers within apertures within topographic substrate layers employed within microelectronics fabrications. More particularly, the present invention relates to high density plasma chemical vapor deposition (HDP-CVD) methods in conjunction with chemical mechanical polish (CMP) planarizing methods for forming patterned planarized aperture fill layers within apertures within topographic substrate layers employed within microelectronics fabrications.

2. Description of the Related Art

Semiconductor integrated circuit microelectronics fabrications are formed from semiconductor substrates within and upon whose surfaces are formed semiconductor integrated circuit devices. The semiconductor integrated circuit devices are connected internally and externally to the semiconductor substrates upon which they are formed through use of patterned conductor layers which are separated by dielectric layers.

As semiconductor integrated circuit microelectronics fabrication integration levels have increased and semiconductor integrated circuit device and patterned conductor layer dimensions have decreased, it has become more prevalent in the art of semiconductor integrated circuit microelectronics fabrication to employ trench isolation methods, such as but not limited to shallow trench isolation (STI) methods and recessed oxide isolation (ROI) methods, to form patterned planarized trench isolation regions within isolation trenches within semiconductor substrates in order to separate active regions of the semiconductor substrates within and upon which are formed semiconductor integrated circuit devices.

Such shallow trench isolation (STI) methods and recessed oxide isolation (ROI) methods are desirable for forming patterned planarized trench isolation regions within isolation trenches within semiconductor substrates employed within semiconductor integrated circuit microelectronics fabrications since shallow trench isolation (STI) methods and recessed oxide isolation (ROI) methods typically provide patterned planarized trench isolation regions which are nominally co-planar with the surfaces of adjoining active regions of a semiconductor substrate which they separate. Such nominally co-planar patterned planarized trench isolation regions and adjoining active regions of a semiconductor substrate generally optimize an attenuated depth of focus typically achievable with an advanced photoexposure apparatus employed when forming advanced semiconductor integrated circuit devices and patterned conductor layers within an advanced semiconductor integrated circuit microelectronics fabrication.

Of the methods which may be employed for forming patterned planarized shallow trench isolation (STI) regions within semiconductor substrates employed within semiconductor integrated circuit microelectronics fabrications, high density plasma chemical vapor deposition (HDP-CVD) methods employed in conjunction with chemical mechanical polish (CMP) planarizing methods have recently received considerable attention. High density plasma chemical vapor deposition (HDP-CVD) methods are typically characterized as, and alternately known as, simultaneous chemical vapor deposition (CVD) and inert gas ion sputter (typically argon ion sputter) methods, where a deposition rate within the chemical vapor deposition (CVD) method exceeds a sputtering rate within the inert gas ion sputtering method.

While high density plasma chemical vapor deposition (HDP-CVD) methods undertaken in conjunction with chemical mechanical polish (CMP) planarizing methods are thus desirable within the art of semiconductor integrated circuit microelectronics fabrication for forming patterned planarized trench isolation regions within isolation trenches within semiconductor substrates employed within advanced semiconductor integrated circuit microelectronics fabrications, patterned planarized trench isolation regions are often not formed entirely without problems within semiconductor integrated circuit microelectronics fabrications while employing high density plasma chemical vapor deposition (HDP-CVD) methods in conjunction with chemical mechanical polish (CMP) planarizing methods. In particular, it is often difficult to form with optimal uniformity and planarity, and with attenuated semiconductor substrate damage, a series of patterned planarized trench isolation regions within a series of isolation trenches separated by a series of mesas of varying width but substantially equivalent height within a semiconductor substrate while employing a high density plasma chemical vapor deposition (HDP-CVD) method in conjunction with a chemical mechanical polish (CMP) planarizing method as is conventional in the art of semiconductor integrated circuit microelectronics fabrication.

It is thus towards the goal of forming within a semiconductor integrated circuit microelectronics fabrication with optimal uniformity and planarity and with attenuated semiconductor substrate damage a series of patterned planarized trench isolation regions within a series of isolation trenches separated by a series of mesas of varying width while employing a high density plasma chemical vapor deposition (HDP-CVD) method in conjunction with a chemical mechanical polish (CMP) planarizing method, that the present invention is more specifically directed. In a more general sense, the present invention is also directed towards providing a method for forming within a microelectronics fabrication which need not necessarily be a semiconductor integrated circuit microelectronics fabrication, with optimal uniformity and planarity and with attenuated microelectronics substrate damage, a series of patterned planarized aperture fill layers within a series of apertures separated by a series of mesas of varying width, while employing a high density plasma chemical vapor deposition (HDP-CVD) method in conjunction with a chemical mechanical polish (CMP) planarizing method.

Various methods have been disclosed in the art of microelectronics fabrication for forming planarized aperture fill layers within apertures within topographic substrate layers employed within microelectronics fabrications.

For example, Nag et al., in "Comparative Evaluation of Gap-Fill Dielectrics in Shallow Trench Isolation for Sub-0.25 $\mu$m Technologies," IEDM 96, IEEE, pp. 841–44, compares a series of physical and electrical properties for each of several dielectric materials formed employing several corresponding deposition methods which may be employed in conjunction with chemical mechanical polish (CMP) planarizing methods for forming patterned planarized trench isolation regions within isolation trenches within semiconductor substrates employed within semiconductor integrated circuit microelectronics fabrications.

In addition, Avanzino et al., in U.S. Pat. No. 4,954,459, discloses a polishing planarizing method for forming a planarized aperture fill dielectric layer within an aperture, such as but not limited to an isolation trench, within a topographic substrate layer, such as but not limited to a semiconductor substrate, employed within a semiconductor integrated circuit microelectronics fabrication. The method employs a conformal dielectric oxide layer formed over the topographic substrate layer, where upper lying portions of the conformal dielectric oxide layer corresponding with upper lying features of an underlying topography of the topographic substrate layer are selectively etched prior to a polish planarizing of the etched conformal dielectric oxide layer so formed.

Further, Sato, in U.S. Pat. No. 5,182,221, discloses an electron cyclotron resonance chemical vapor deposition (ECR-CVD) method for forming a void free planarized aperture fill layer within an aperture within a topographic substrate layer employed within a microelectronics fabrication, where the void free planarized aperture fill layer is formed without increasing an aspect ratio of the aperture into which is formed the void free planarized aperture fill layer. The method realizes the foregoing result by employing within the method a deposition rate ratio for vertical surface deposition of the void free planarized aperture fill layer with respect to horizontal surface deposition of the void free planarized aperture fill layer equal to twice the depth of the aperture into which is formed the void free planarized aperture fill layer divided by the width of the aperture into which is formed the void free planarized aperture fill layer.

Yet further, Grewal et al., in U.S. Pat. No. 5,212,114, discloses a non-polishing planarizing method for forming a planarized aperture fill layer filling a series of apertures within a topographic substrate layer formed within a microelectronics fabrication. The method employs a patterned photoresist etch stop layer formed interposed between a conformal dielectric layer formed upon the topographic substrate layer and a sacrificial planarizing layer formed over the topographic substrate layer, where the sacrificial planarizing layer and upper lying portions of the conformal dielectric layer are etched back employing an anisotropic etch method prior to stripping from the topographic substrate layer the patterned photoresist layer and forming over the topographic substrate layer a second dielectric layer.

Still further, Bose et al., in U.S. Pat. No. 5,492,858, discloses a polish planarizing method for forming a planarized trench isolation region within an isolation trench of high aspect ratio within a semiconductor substrate employed within a semiconductor integrated circuit microelectronics fabrication. The method employs forming a silicon nitride trench liner layer within the isolation trench prior forming within the isolation trench a conformal oxide dielectric layer which is subsequently steam annealed and polish planarized to form the planarized trench isolation region exhibiting enhanced properties.

Still yet further, Jain, in U.S. Pat. No. 5,494,854, discloses a chemical mechanical polish (CMP) planarizing method for planarizing a dielectric layer formed over a series of patterned conductor layers of equivalent thickness, but differing aspect ratios, formed within a microelectronics fabrication. The method employs forming a first gap filling dielectric layer for planarizing apertures formed interposed between at least the patterns which comprise a high aspect ratio portion of the patterned conductor layers, where the first gap filling dielectric layer has formed thereupon a second dielectric layer which is chemical mechanical polish (CMP) planarized with enhanced throughput, planarity and uniformity.

Finally, Gocho et al., in U.S. Pat. No. 5,498,565, discloses a high density plasma chemical vapor deposition (HDP-CVD) method in conjunction with a chemical mechanical polish (CMP) planarizing method for forming a series of patterned planarized trench isolation regions within a series of isolation trenches separated by a series of mesas of varying width within a semiconductor integrated circuit microelectronics fabrication. The method employs a masked isotropic etching of a portion of a comparatively thicker portion of a high density plasma chemical vapor deposited (HDP-CVD) dielectric layer formed upon a wider mesa within the series of mesas prior to chemical mechanical polish (CMP) planarizing the high density plasma chemical vapor deposited (HDP-CVD) dielectric layer.

Desirable within the art of microelectronics fabrication are additional high density plasma chemical vapor deposition (HDP-CVD) methods employed in conjunction with chemical mechanical polish (CMP) planarizing methods which may be employed for forming within a microelectronics fabrication with optimal uniformity and planarity and with attenuated microelectronics substrate damage a series of patterned planarized aperture fill layers within a series of apertures separated by a series of mesas of varying width. More particularly desirable within the art of semiconductor integrated circuit microelectronics fabrication are additional high density plasma chemical vapor deposition (HDP-CVD) methods employed in conjunction with chemical mechanical polish (CMP) planarizing methods which may be employed for forming within a semiconductor substrate with optimal uniformity and planarity and with attenuated semiconductor substrate damage a series of patterned planarized trench isolation regions within a series of isolation trenches separated by a series of mesas of varying width.

It is towards the foregoing goals that the present invention is both generally and more specifically directed.

SUMMARY OF THE INVENTION

A first object of the present invention is to provide high density plasma chemical vapor deposition (HDP-CVD) method employed in conjunction with a chemical mechanical polish (CMP) planarizing method for forming within a topographic substrate layer employed within a microelectronics fabrication a series of patterned planarized aperture fill layers.

A second object of the present invention is to provide a method in accord with the first object of the present invention, where the series of patterned planarized aperture fill layers is formed with optimal uniformity and planarity and with attenuated topographic substrate layer damage.

A third object of the present invention is to provide a method in accord with the first object of the present invention or the second object of the present invention, where the microelectronics fabrication is a semiconductor integrated circuit microelectronics fabrication, the topographic substrate layer is a semiconductor substrate employed within the semiconductor integrated circuit microelectronics fabrication, the series of apertures is a series of isolation trenches formed within the semiconductor substrate and the series of patterned planarized aperture fill layers is a series of patterned planarized trench isolation regions formed within the series of isolation trenches.

A fourth object of the present invention is to provide a method in accord with the first object of the present invention, the second object of the present invention or the third object of the present invention, which method is readily commercially implemented.

In accord with the objects of the present invention, there is provided by the present invention a chemical mechanical polish (CMP) planarizing method for forming a series of patterned planarized aperture fill layers within a series of apertures within a topographic substrate layer employed within a microelectronics fabrication. To practice the method of the present invention, there is first provided a topographic substrate layer employed within a microelectronics fabrication. The topographic substrate layer comprises a series of mesas of substantially equivalent height but of differing widths, where the series of mesas is separated by a series of apertures. There is then formed upon the topographic substrate layer a blanket first aperture fill layer. The blanket first aperture fill layer is formed employing a simultaneous deposition and sputter method, where the blanket first aperture fill layer fills the series of apertures to a planarizing thickness at least as high as the height of the mesas while simultaneously forming a series of protrusions of the blanket first aperture fill layer corresponding with the series of mesas. The thickness of a protrusion of the blanket first aperture fill layer over a narrow mesa is less than the thickness of a protrusion of the blanket first aperture fill layer over a wide mesa. The deposition and sputter method employs a deposition rate:sputter rate ratio which provides sufficient thickness of the blanket first aperture fill layer over the narrow mesa such that upon chemical mechanical polish (CMP) planarity the blanket first aperture fill layer to form a series of patterned planarized first aperture fill layers within the series of apertures erosion of the narrow mesa is attenuated. Finally, there is then chemical mechanical polish (CMP) planarized the blanket first aperture fill layer to form the series of patterned planarized first aperture fill layers within the series of apertures.

There is provided by the present invention a high density plasma chemical vapor deposition (HDP-CVD) method employed in conjunction with a chemical mechanical polish (CMP) planarizing method for forming within a topographic substrate layer employed within a microelectronics fabrication a series of patterned planarized aperture fill layers, where the series of patterned planarized aperture fill layers is formed with optimal uniformity and planarity and with attenuated topographic substrate layer damage. The method of the present invention realizes the foregoing objects by employing within the high density plasma chemical vapor deposition (HDP-CVD) method when forming a blanket planarized aperture fill layer from which is subsequently formed employing a chemical mechanical polish (CMP) planarizing method a series of patterned planarized aperture fill layers a deposition rate:sputtering rate ratio which provides a sufficient thickness of a protrusion of the blanket aperture fill layer upon a narrow mesa such that when chemical mechanical polish (CMP) planarizing the blanket aperture fill layer the series of patterned planarized aperture fill layers is formed with optimal uniformity and planarity and with attenuated topographic substrate layer damage.

The method of the present invention may be employed where the microelectronics fabrication is a semiconductor integrated circuit microelectronics fabrication, the topographic substrate layer is a semiconductor substrate employed within the semiconductor integrated circuit microelectronics fabrication, the series of apertures is a series of isolation trenches formed within the semiconductor substrate and the series of patterned planarized aperture fill layers is a series of patterned planarized trench isolation regions formed within the series of isolation trenches. The method of the present invention does not discriminate with respect to the nature of a microelectronics fabrication within which may be formed a series of patterned planarized aperture fill layers in accord with the method of the present invention. Thus, although the method of the present invention provides substantial value when forming a series of patterned planarized trench isolation regions within a series of isolation trenches within a semiconductor substrate employed within a semiconductor integrated circuit microelectronics fabrication, the method of the present invention may also be employed in forming a series of patterned planarized aperture fill layers including but not limited to patterned planarized aperture fill conductor layers, patterned planarized aperture fill semiconductor layers and patterned planarized aperture fill dielectric layers within trenches other than isolation trenches within substrates including but not limited to conductor substrates, semiconductor substrates, dielectric substrates and composites thereof employed within microelectronics fabrications including but not limited to semiconductor integrated circuit microelectronics fabrications solar cell microelectronics fabrications, ceramic substrate microelectronics fabrications and flat panel display microelectronics fabrications.

The method of the present invention is readily commercially implemented. The method of the present invention employs high density plasma chemical vapor deposition (HDP-CVD) methods in conjunction with chemical mechanical polish (CMP) planarizing methods as are generally known in the art of microelectronics fabrication. Since it is the process control within the method of the present invention which provides at least in part the method of the present invention, rather than the existence of the microelectronics fabrication methods which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a high density plasma chemical vapor deposition (HDP-CVD) method in conjunction with a chemical mechanical polish (CMP) planarizing method for forming within a microelectronics fabrication a series of patterned planarized aperture fill layers within a series of apertures within a topographic substrate layer comprising a series of mesas of substantially equivalent height but differing widths, where the series of patterned planarized aperture fill layers is formed with optimal uniformity and planarity while providing attenuated topographic substrate damage. The present invention realizes the foregoing objects by employing within the high density plasma chemical vapor deposition (HDP-CVD) method a deposition rate:sputter rate ratio which provides a blanket aperture fill layer of sufficient thickness over a comparatively narrow mesa in comparison with a comparatively wide mesa such that upon chemical mechanical polish (CMP) planarizing the blanket aperture fill layer there is formed the series of patterned planarized aperture fill layers with optimal uniformity and planarity and attenuated topographic substrate damage.

Although the method of the present invention provides value when forming patterned planarized trench isolation regions within isolation trenches within semiconductor substrates employed within semiconductor integrated circuit microelectronics fabrications, the method of the present invention may also be employed within microelectronics fabrications including but not limited to semiconductor integrated circuit microelectronics fabrications, solar cell microelectronics fabrications, ceramic substrate microelectronics fabrications and flat panel display microelectronics fabrications to form therein patterned planarized aperture fill layers including but not limited to patterned planarized aperture fill conductor layers, patterned planarized aperture fill semiconductor layers and patterned planarized aperture fill dielectric layers with similarly optimal uniformity and planarity while attenuating substrate damage to topographic substrate layers including but not limited to topographic conductor substrate layers, topographic semiconductor substrate layers, topographic dielectric substrate layers and composites thereof.

First Preferred Embodiment

Figure 1:
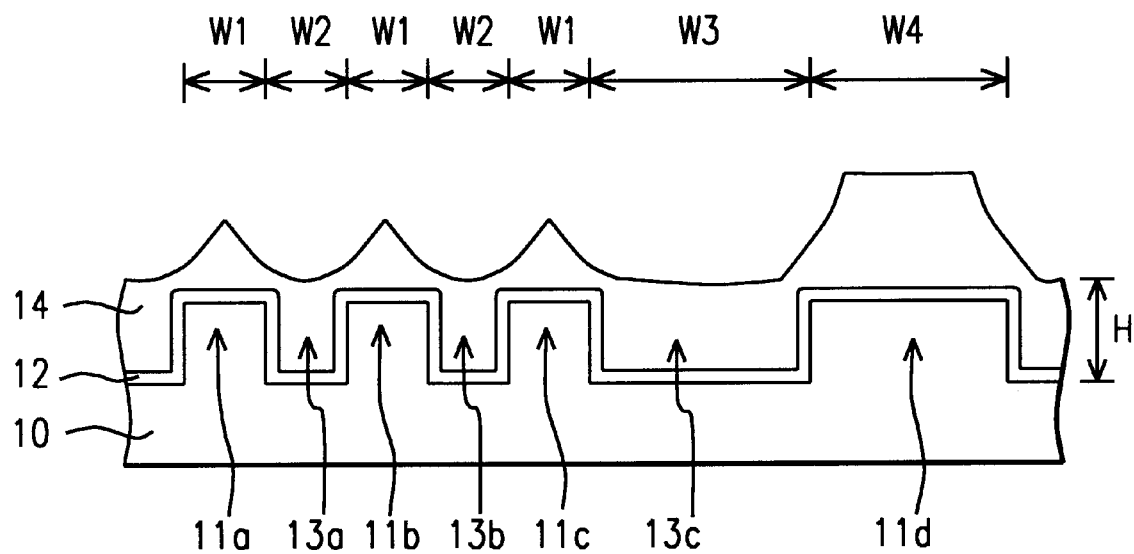
FIG. 1, FIG. 2, FIG. 3, FIG. 4, FIG. 5, FIG. 6, FIG. 7 and FIG. 8 show a series of schematic cross-sectional diagrams illustrating the results of forming within a microelectronics fabrication in accord with a general embodiment of the present invention which comprises a first preferred embodiment of the present invention a series of patterned planarized aperture fill layers within a series of apertures within a topographic substrate layer while employing the method of the present invention.

Referring now to FIG. 1 to FIG. 8, there is shown a series of schematic cross-sectional diagrams illustrating the results of forming within a microelectronics fabrication in accord with a general embodiment of the present invention which comprises a first preferred embodiment of the present invention a series of patterned planarized aperture fill layers within a topographic substrate layer defined by a series of mesas of substantially equivalent height but differing widths, where the series of patterned planarized aperture fill layers is formed employing a high density plasma chemical vapor deposition (HDP-CVD) method followed by a chemical mechanical polish (CMP) planarizing method. Shown in FIG. 1 is a schematic cross-sectional diagram of the microelectronics fabrication at an early stage in its fabrication in accord with the method of the present invention.

Shown in FIG. 1 is a topographic substrate layer 10 defined by a series of narrow mesas 11a, 11b and 11c of width W1 having interposed therebetween a pair of narrow apertures 13a and 13b of width W2, where the series of narrow mesas 11a, 11b and 11c is separated from a wide mesa 11d of width W4 by a wide aperture 13c of width W3. Within the first preferred embodiment of the present invention, the topographic substrate layer 10 may be employed within a microelectronics fabrication selected from the group including but not limited to semiconductor integrated circuit microelectronics fabrications, solar cell microelectronics fabrications, ceramic substrate microelectronics fabrications and flat panel display microelectronics fabrications.

Although not specifically illustrated within the schematic cross-sectional diagram of FIG. 1, the topographic substrate layer 10 may be formed from the substrate alone employed within the microelectronics fabrication, or in the alternative, the topographic substrate layer 10 may be formed employing a composite of a substantially flat substrate employed within the microelectronics fabrication, upon which substantially flat substrate is formed an additional patterned layer to form in the aggregate the topographic substrate layer 10. Within the first preferred embodiment of the present invention, the substrate alone, whether by itself substantially flat or by itself a topographic substrate layer, in conjunction with the patterned layer, may each be formed independently of materials including microelectronics conductor materials, microelectronics semiconductor materials, microelectronics dielectric materials and composites thereof.

Within the first preferred embodiment of the present invention the width W1 of each narrow mesa 11a, 11b or 11c within the series of narrow mesas 11a, 11b and 11c is typically and preferably from about 0.3 to about 1.0 microns. Similarly, within the first preferred embodiment of the present invention the width W2 of each narrow aperture 13a or 13b within the pair of narrow apertures 13a and 13b is typically and preferably from about 0.3 to about 1.0 microns. Yet similarly, within the first preferred embodiment of the present invention the width W4 of the wide mesa 11d is typically and preferably from about 50 to about 100 microns. Still yet similarly, within the first preferred embodiment of the present invention the width W3 of the wide aperture 13c is typically and preferably from about 500 to about 1000 microns. Finally, within the first preferred embodiment of the present invention, each of the mesas 11a, 11b, 11c and 11d preferably has a substantially equivalent height H, as illustrated in FIG. 1, of from about 3000 to about 5000 angstroms, where the term "substantially" is intended to accommodate localized differences in microelectronics fabrication methods employed when forming the series of mesas 11a, 11b, 11c and 11d.

Shown also within FIG. 1 is a blanket first aperture fill layer 12 formed upon the topographic substrate layer 10 while completely covering the series of mesas 11a, 11b, 11c and 11d and simultaneously partially filling the series of apertures 13a, 13b and 13c. Within the first preferred embodiment of the present invention, the blanket first aperture fill layer 12 is optional and it is formed employing a first high density plasma chemical vapor deposition (HDP-CVD) method where a first deposition rate:sputter rate ratio employed within the first high density plasma chemical vapor deposition (HDP-CVD) method is chosen to optimize gap filling of the blanket first aperture fill layer 12 while simultaneously attenuating topographic substrate layer 10 damage when forming the blanket first aperture fill layer 12 and a blanket second aperture fill layer subsequently formed upon the blanket first aperture fill layer. The thickness to which the blanket first aperture fill layer 12 is formed is selected to optimize gap filling of the blanket first aperture fill layer 12 and a blanket second aperture fill layer which is subsequently formed upon the optional blanket first aperture fill layer 12. Typically and preferably, the first deposition rate:sputter rate ratio will be from about 2:1 to about 4:1, more preferably from about 2.5:1 to about 3.5:1, most preferably from about 2.75:1 to about 3.25:1, while the thickness of the blanket first aperture fill layer 12 is typically and preferably from about 2000 to about 4000 angstroms.

Within the method of the present invention a deposition rate:sputter rate ratio employed within a high density plasma chemical vapor deposition (HDP-CVD) method employed for forming a blanket aperture fill layer is readily ascertained by determining a deposition rate of a blanket aperture fill layer formed employing the high density plasma chemical vapor deposition (HDP-CVD) method in absence of a bias sputtering power within the high density plasma chemical vapor deposition (HDP-CVD) method (but in the presence of a bias sputtering material such as argon) while similarly determining a sputtering rate of the blanket aperture fill layer in absence of a radio frequency plasma source activation power (but in the presence of appropriate source material(s) from which are formed the blanket aperture fill layer).

Finally, there is shown in FIG. 1, a blanket second aperture fill layer 14 formed upon the blanket first aperture fill layer 12. Similarly with the blanket first aperture fill layer 12, the blanket second aperture fill layer 14 is formed employing a second high density plasma chemical vapor deposition (HDP-CVD) method which typically and preferably employs source materials equivalent to the source materials employed when forming the blanket first aperture fill layer 12 to thus form the blanket second aperture fill layer 14 of composition typically nominally equivalent to the composition of the blanket first aperture fill layer 12. However, within the method of the present invention, the blanket second aperture fill layer 14 is formed employing a second deposition rate:sputter rate ratio which provides a first thickness of the blanket second aperture fill layer 14 over each one of the narrow mesas 11a, 11b and 11c and a second thickness of the blanket second aperture fill layer 14 over the wide meas 11d such that when at least a portion of the blanket second aperture fill layer 14 is planarized to form a series of patterned planarized aperture fill layers within the apertures 13a, 13b and 13c, the patterned planarized aperture fill layers so formed are formed with optimal uniformity and planarity and with attenuated topographic substrate layer 10 damage. Typically and preferably, the second deposition rate:sputter rate ratio is from about 5:1 to about 7:1, more preferably from about 5.5:1 to about 6.5:1, most preferably from about 5.75:1 to about 6.25:1, and thus the first deposition rate:sputter rate ratio is less than the second deposition rate:sputter rate ratio. Within the first preferred embodiment of the present invention, the blanket second aperture fill layer 14 is formed to a planarizing thickness at least as thick as the height H of the mesas 11a, 11b, 11c and 11d as illustrated in FIG. 1, which planarizing thickness is typically and preferably from about 2000 to about 4000 angstroms.

Figure 2:
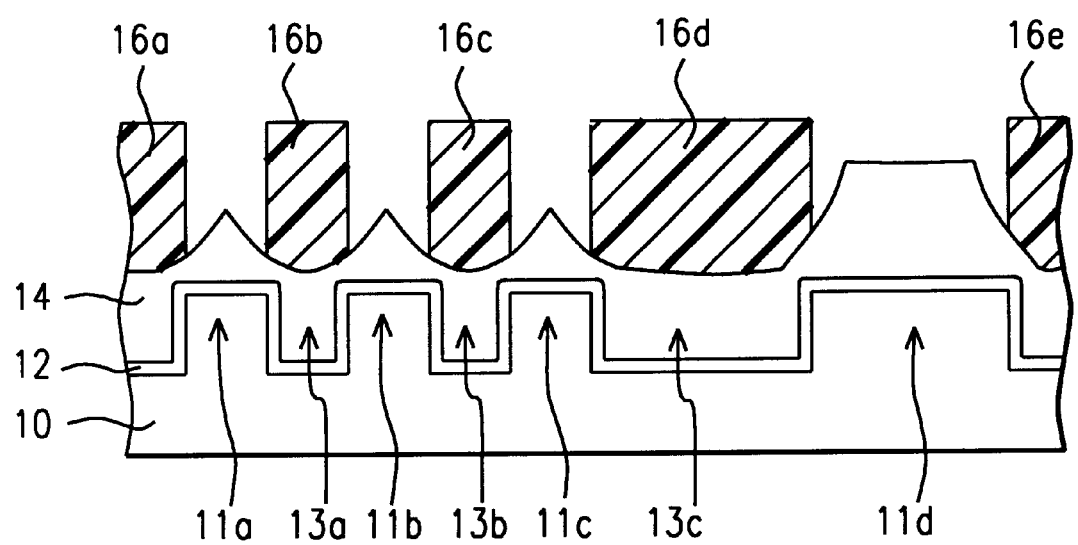
Figure 3:
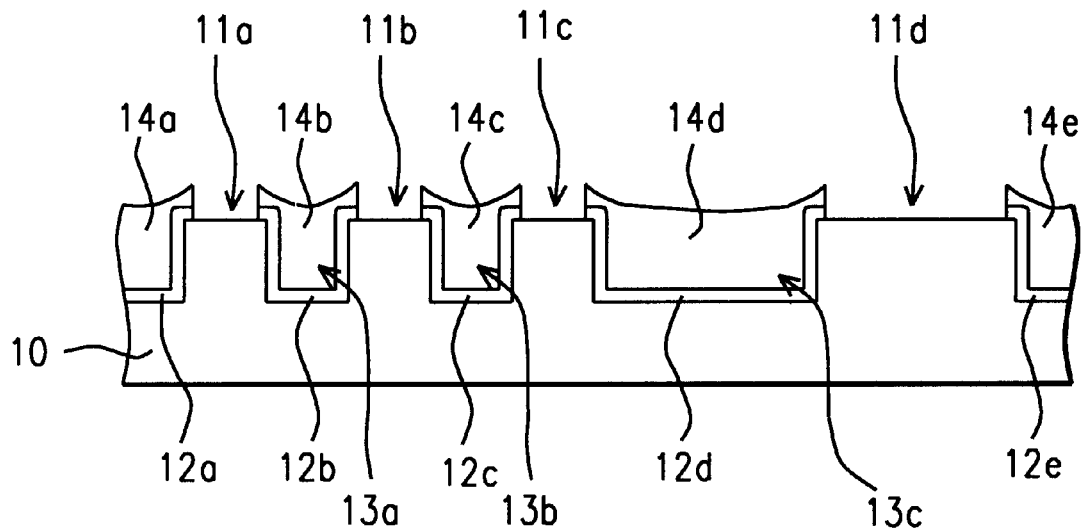

Referring now to FIG. 2 and FIG. 3, there is shown a pair of schematic cross-sectional diagrams illustrating the results of optional further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein there is formed upon the blanket second aperture fill layer 14 a series of patterned photoresist layers 16a, 16b, 16c, 16d and 16e which leave exposed portions of the blanket second aperture fill layer 14 formed over the series of mesas 11a, 11b, 11c and 11d. Similarly, there is shown in FIG. 3 a schematic cross-sectional diagram of a microelectronics fabrication otherwise equivalent to the microelectronics fabrication whose schematic cross-sectional diagram is illustrated in FIG. 2, but wherein: (1) the blanket second aperture fill layer 14 and the blanket first aperture fill layer 12 have been etched to form the corresponding series of patterned second aperture fill layers 14a, 14b, 14c, 14d and 14e and the corresponding series of patterned first aperture fill layers 12a, 12b, 12c, 12d and 12e while employing the series of patterned photoresist layers 16a, 16b, 16c, 16d and 16e as a series of photoresist etch mask layers; and (2) there is then stripped the series of patterned photoresist layers 16a, 16b, 16c, 16d and 16e from the microelectronics fabrication.

Within the first preferred embodiment of the present invention, the microelectronics fabrication whose schematic cross-sectional diagram is illustrated in FIG. 2 may be formed from the microelectronics fabrication whose schematic cross-sectional diagram is illustrated in FIG. 1 employing patterned photoresist layer formation methods as are conventional in the art of microelectronics fabrication. Typically and preferably, each patterned photoresist layer within the series of patterned photoresist layers 16a, 16b, 16c, 16d and 16e is formed to a thickness of from about 6000 to about 10000 angstroms, employing a photoresist material as is conventional in the art of microelectronics fabrication. Typically and preferably, each of the patterned photoresist layers 16a, 16b, 16c, 16d and 16e will have a linewidth preferably somewhat wider than an aperture over which is formed, in order to accommodate misregistration of a patterned photoresist layer with respect to an aperture.

With respect to forming the microelectronics fabrication whose schematic cross-sectional diagram is illustrated in FIG. 3 from the microelectronics fabrication whose schematic cross-sectional diagram is illustrated in FIG. 2, there may be employed blanket second aperture fill layer 14 and blanket first aperture fill layer 12 etch methods are know in the art of microelectronics fabrication, in conjunction with patterned photoresist layer stripping methods as are similarly conventional in the art of microelectronics fabrication. The blanket second aperture fill layer 14 and the blanket first aperture fill layer 12 may be etched employing isotropic or, preferably, anisotropic etchants as are appropriate to the material from which is formed the blanket second aperture fill layer 14 and the blanket first aperture fill layer 12. Similarly, the patterned photoresist layers 16a, 16b, 16c, 16d and 16e may be stripped employing wet chemical photoresist stripping methods and dry plasma photoresist stripping methods as are also known in the art of microelectronics fabrication.

Although not specifically illustrated within the schematic cross-sectional diagram of FIG. 3 it is not required within the method of the present invention that the blanket second aperture fill layer 14 and the blanket first aperture fill layer 12 be completely etched in forming the patterned second aperture fill layers 14a, 14b, 14c, 14d, and 14e, along with the patterned first aperture fill layers 12a, 12b, 12c, 12d and 12e. Rather, it is also plausible, and under certain circumstances preferred, within the method of the present invention that at least the optional blanket first aperture fill layer 12 not be completely etched and/or the blanket second aperture fill layer 14 not be completely etched.

Figure 4:
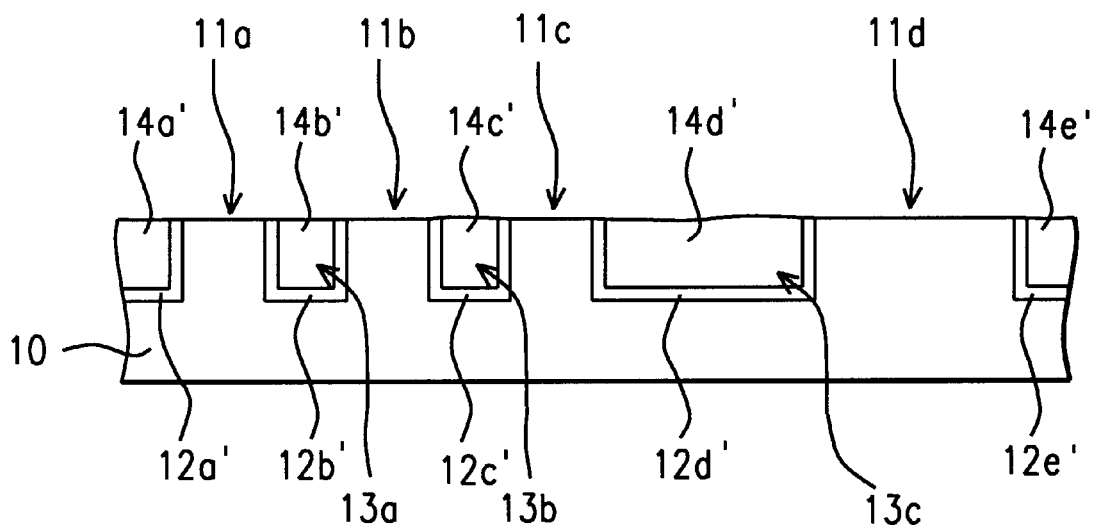

Referring now to FIG. 4, there is show a schematic cross-sectional diagram illustrating the results of further processing of the microelectronics fabrication whose schematic cross-sectional diagram is illustrated in FIG. 1 or FIG. 3. Shown in FIG. 4 is a schematic cross-sectional diagram of a microelectronics fabrication otherwise equivalent to the microelectronics fabrication whose schematic cross-sectional diagram is illustrated in FIG. 1 or FIG. 3, but wherein either: (1) the blanket second aperture fill layer 14 and the blanket first aperture fill layer 12 have been chemical mechanical polish (CMP) planarized to form the corresponding patterned planarized second aperture fill layers 14a', 14b', 14c', 14d' and 14e' and the corresponding patterned planarized first aperture fill layers 12a', 12b', 12c', 12d' and 12e'; or (2) the patterned second aperture fill layers 14a, 14b, 14c, 14d and 14e and the patterned first aperture fill layers 12a, 12b, 12c, 12d and 12e have been chemical mechanical polish (CMP) planarized to form the corresponding patterned planarized second aperture fill layers 14a', 14b', 14c', 14d' and 14e' and the corresponding patterned planarized first aperture fill layers 12a', 12b', 12c', 12d' and 12e'.

Although either of the microelectronics fabrications whose schematic cross-sectional diagram is illustrated in FIG. 1 or FIG. 3 may be chemical mechanical polish (CMP) planarized to form the microelectronics fabrication whose schematic cross-sectional diagram is illustrated in FIG. 4, the microelectronics fabrication whose schematic cross-sectional diagram is illustrated in FIG. 4 is formed with optimal uniformity and planarity of the patterned planarized second aperture fill layers 14a', 14b', 14c', 14d' and 14e' and the patterned planarized first aperture fill layers 12a', 12b', 12c', 12d' and 12e' with simultaneously attenuated topographic substrate layer 10 damage. The foregoing results are realized at least in part as a result of a choice of a second deposition rate:sputter rate ratio when forming the blanket second aperture fill layer 14.

Figure 5:
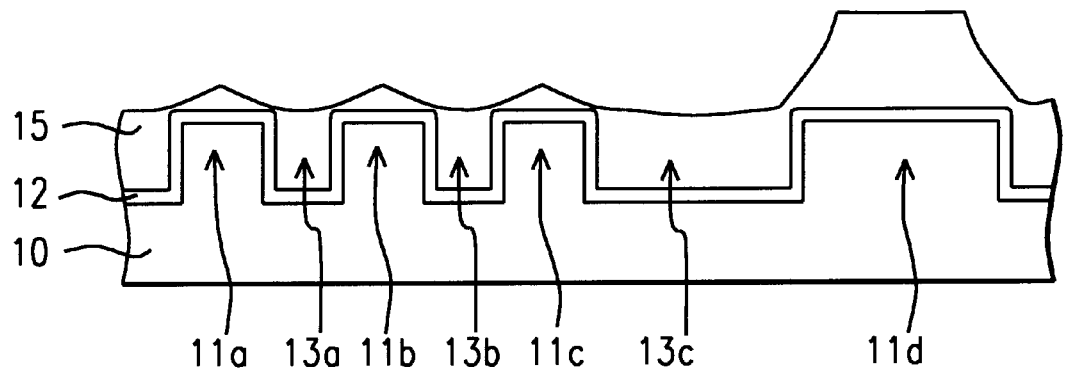

Referring now to FIG. 5 to FIG. 8, there is shown a series of schematic cross-sectional diagrams illustrating the results of forming within a microelectronics fabrication in accord with an alternate general embodiment of the present invention which comprises an alternate first preferred embodiment of the present invention a series of patterned planarized aperture fill layers within a series of apertures within a topographic substrate layer. Shown in FIG. 5 is a schematic cross-sectional diagram of the microelectronics fabrication at an early stage in its fabrication.

Shown in FIG. 5 is a schematic cross-sectional diagram of a microelectronics fabrication otherwise equivalent to the microelectronics fabrication whose schematic cross-sectional diagram is illustrated in FIG. 1, but wherein instead of the blanket second aperture fill layer 14, there is in the alternative formed the blanket second aperture fill layer 15. Whereas within the schematic cross-sectional diagram of FIG. 1 the blanket second aperture fill layer 14 is formed with a higher deposition rate:sputter rate ratio than the blanket first aperture fill layer 12, within the alternate first preferred embodiment of the present invention as illustrated within the schematic cross-sectional diagram of FIG. 5 the blanket second aperture fill layer 15 is formed with lower deposition rate:sputter rate ratio than the blanket first aperture fill layer 12. Under such circumstances, the deposition rate:sputter rate ratio of the optional blanket first aperture fill layer 12 may be maintained constant within the first preferred embodiment and the alternate first preferred embodiment of the present invention, while the deposition rate:sputter rate ratio of the blanket second aperture fill layer 15 is decreased with respect to the blanket second aperture fill layer 14. Alternatively, the deposition rate:sputter rate ratios for the blanket first aperture fill layer 12 and the blanket second aperture fill layer 14 as cited above and employed within the first preferred embodiment of the present invention may be inverted within the corresponding blanket first aperture fill layer 12 and blanket second aperture fill layer 15 employed within the alternate first preferred embodiment of the present invention. As is illustrated within the schematic cross-sectional diagram of FIG. 5 in comparison with the schematic cross-sectional diagram of FIG. 1, the blanket second aperture fill layer 15 is formed with a lesser thickness over the series of narrow mesas 11a, 11b and 11c than is the blanket second aperture fill layer 14.

Figure 6:
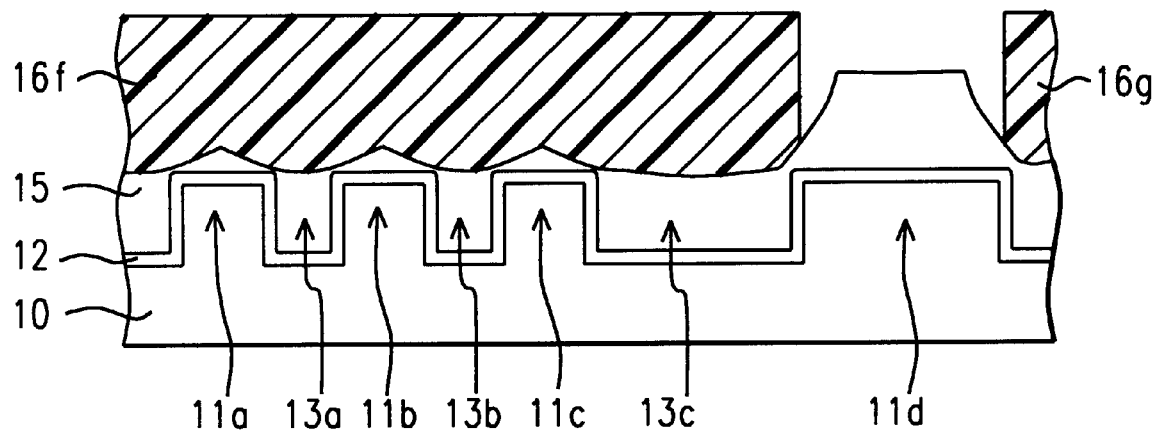

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein there is formed upon the blanket second aperture fill layer 15 a pair of patterned photoresist layers 16f and 16g. As is illustrated within the schematic cross-sectional diagram of FIG. 6, the pair of patterned photoresist layers 16f and 16g leave exposed a portion of the blanket second aperture fill layer 15 over the wide mesa 11d, but completely cover a portion of the blanket second aperture fill layer 15 over the series of narrow mesas 11a, 11b and 11c. The pair of patterned photoresist layers 16f and 16g may be formed employing methods, materials and thickness dimensions analogous or equivalent to the methods, materials and thickness dimensions employed for forming the series of patterned photoresist layers 16a, 16b, 16c, 16d and 16e as illustrated within the microelectronics fabrication whose schematic cross-sectional diagram is illustrated in FIG. 2.

Figure 7:
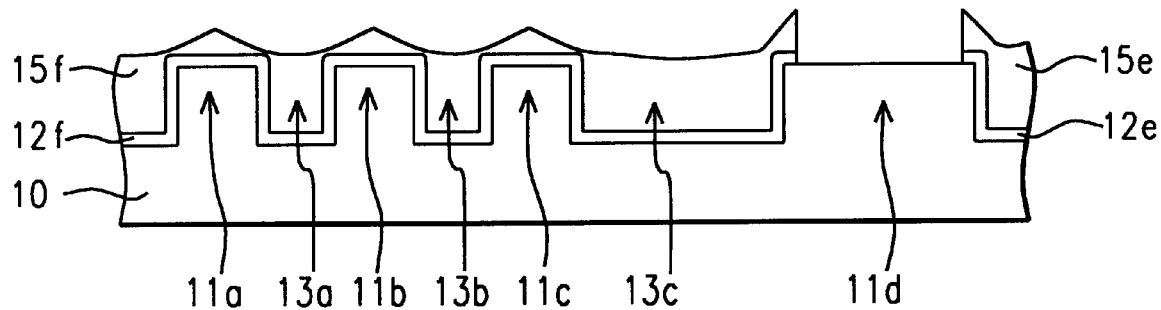

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein: (1) the blanket second aperture fill layer 15 and the blanket first aperture fill layer 12 have been etched to form the corresponding pair of patterned second aperture fill layers 15e and 15f, and the corresponding pair of patterned first aperture fill layers 12e and 12f; and (2) the patterned photoresist layers 16f and 16g have been stripped from the microelectronics fabrication. The microelectronics fabrication whose schematic cross-sectional diagram is illustrated in FIG. 7 may be formed from the microelectronics fabrication whose schematic cross-sectional diagram is illustrated in FIG. 6 employing methods and materials analogous or equivalent to the methods and materials employed in forming the microelectronics fabrication whose schematic cross-sectional diagram is illustrated in FIG. 3 from the microelectronics fabrication whose schematic cross-sectional diagram is illustrated in FIG. 2. As is illustrated within the schematic cross-sectional diagram of FIG. 7, at least the blanket second aperture fill layer 15 is etched such that the series of protrusions of the patterned second aperture fill layer 15f over the series of narrow mesas 11a, 11b and 11c are approximate in height with the pair of protrusions of the patterned second aperture fill layers 15e and 15f over the wide mesa 11d.

Figure 8:
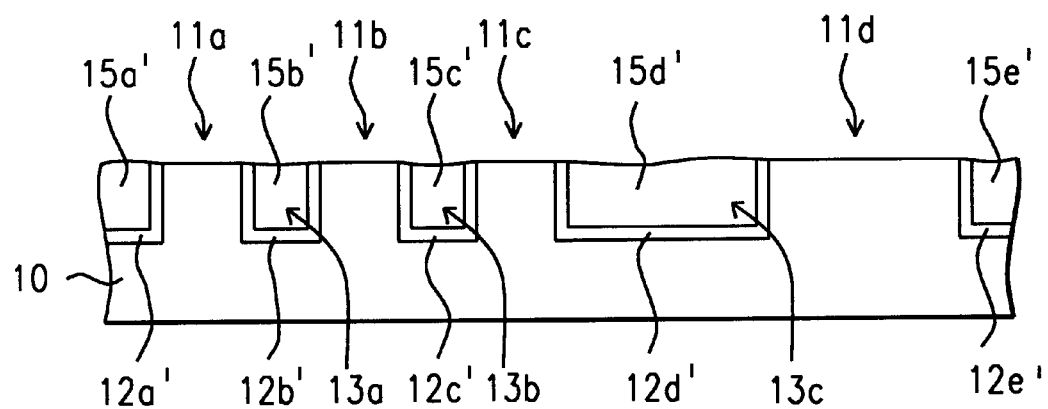

Referring now to FIG. 8, there is shown a schematic cross-sectional diagram illustrating the results of further processing of the microelectronics fabrication whose schematic cross-sectional diagram is illustrated in FIG. 7. Shown in FIG. 8 is a schematic cross-sectional diagram of a microelectronics fabrication otherwise equivalent to the microelectronics fabrication whose schematic cross-sectional diagram is illustrated in FIG. 7, but wherein the patterned second aperture fill layers 15e and 15f and the patterned first aperture fill layers 12e and 12f have been planarized to form a series of patterned planarized first aperture fill layers 12a', 12b', 12c', 12d' and 12e' having formed thereupon a series of patterned planarized second aperture fill layers 15a', 15b', 15c', 15d' and 15e'. The microelectronics fabrication whose schematic cross-sectional diagram is illustrated in FIG. 8 is formed from the microelectronics fabrication whose schematic cross-sectional diagram is illustrated in FIG. 7 employing methods and materials analogous or equivalent to the methods and materials employed for forming the microelectronics fabrication whose schematic cross-sectional diagram is illustrated in FIG. 4 from the microelectronics fabrication whose schematic cross-sectional diagram is illustrated in FIG. 1 or FIG. 3. The only substantive difference between the microelectronics fabrication whose schematic cross-sectional diagram is illustrated in FIG. 8 and the microelectronics fabrication whose schematic cross-sectional diagram is illustrated within FIG. 4 is the substitution within the microelectronics fabrication whose schematic cross-sectional diagram is illustrated in FIG. 8 of the patterned planarized second aperture fill layers 15a', 15b', 15c', 15d' and 15e' in place of the corresponding patterned planarized second aperture fill layers 14a', 14b', 14c', 14d' and 14e' as illustrated within the schematic cross-sectional diagram of FIG. 4.

Similarly with the microelectronics fabrication whose schematic cross-sectional diagram is illustrated in FIG. 4, the microelectronics fabrication whose schematic cross-sectional diagram is illustrated in FIG. 8 is formed with optimal uniformity and planarity of the patterned planarized second aperture fill layers 15a', 15b', 15c', 15d' and 15e' and the patterned planarized first aperture fill layers 12a', 12b', 12c', 12d' and 12e' with simultaneously attenuated topographic substrate layer 10 damage. The foregoing results are realized at least in part as a result of a choice of a second deposition rate:sputter rate ratio when forming the blanket second aperture fill layer 15.

Second Preferred Embodiment

Figure 9:
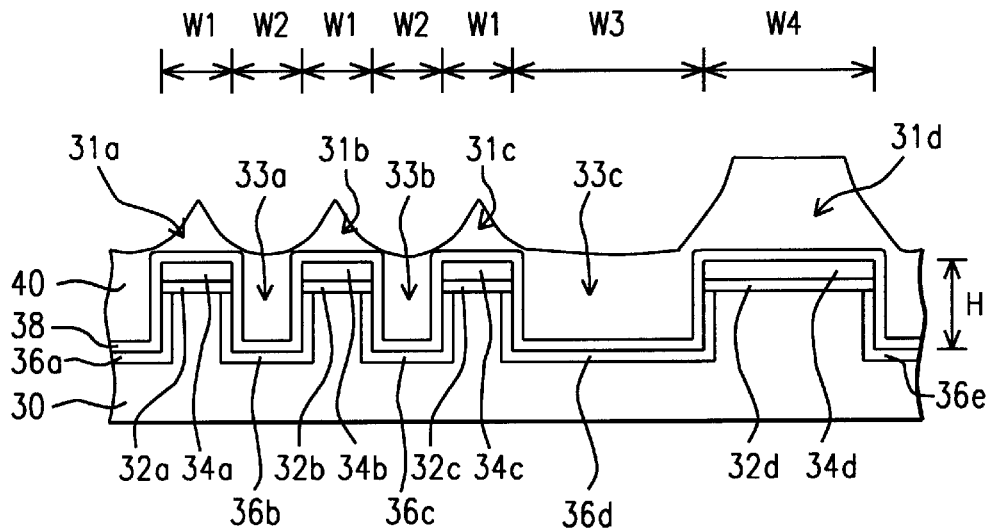
FIG. 9, FIG. 10, FIG. 11, FIG. 12, FIG. 13, FIG. 14, FIG. 15 and FIG. 16 show a series of schematic cross-sectional diagrams illustrating the results of forming within an integrated circuit microelectronics fabrication in accord with a more specific embodiment of the present invention which comprises a second preferred embodiment of the present invention a series of patterned planarized trench isolation regions within a series of isolation trenches within a semiconductor substrate while employing the method of the present invention.

Referring now to FIG. 9 to FIG. 16, there is shown a series of schematic cross-sectional diagrams illustrating the results of forming within a semiconductor integrated circuit microelectronics fabrication in accord with a more specific embodiment of the present invention which comprises a second preferred embodiment of the present invention a series of trench isolation regions within a series of isolation trenches within a silicon semiconductor substrate in accord with the method of the present invention. Shown in FIG. 9 is a schematic cross-sectional diagram of the semiconductor integrated circuit microelectronics fabrication at an early stage in its fabrication in accord with the second preferred embodiment of the present invention.

Shown in FIG. 9 is a silicon semiconductor substrate 30 having formed therein a series of narrow mesas 31a, 31b, and 31c having interposed therebetween a pair of narrow trenches 33a and 33b, where the series of narrow mesas 31a, 31b and 3c is separated from a wide mesa 31d by a wide trench 33c.

Although it is known in the art of semiconductor integrated circuit microelectronics fabrication that silicon semiconductor substrates are available with either dopant polarity, several dopant concentrations and various crystallographic orientations, for the second preferred embodiment of the present invention, the silicon semiconductor substrate 30 is preferably a (100) silicon semiconductor substrate having an N- or P-doping.

Also shown within FIG. 9 formed and aligned upon each of the narrow mesas 31a, 31b and 31c is a patterned thermal silicon oxide pad oxide layer 32a, 32b or 32c in turn having formed and aligned thereupon a patterned silicon nitride layer 34a, 34b or 34c. Similarly, there is also shown within FIG. 9 formed and aligned upon the wide mesa 31d a patterned thermal silicon oxide pad oxide layer 32d in turn having formed and aligned thereupon a patterned silicon nitride layer 34d. Within the second preferred embodiment of the present invention, that patterned thermal silicon oxide pad oxide layers 32a, 32b, 32c and 32d are preferably formed employing a thermal oxidation method where portions of the silicon semiconductor substrate 30 are oxidized at a temperature of from about 800 to about 1000 degrees centigrade to form the patterned thermal silicon oxide pad oxide layers 32a, 32b, 32c and 32d each of thickness about 100 to about 120 angstroms. Similarly, the patterned silicon nitride layers 34a, 34b, 34c and 34d are preferably formed employing a chemical vapor deposition (CVD) method to form the patterned silicon nitride layers 34a, 34b, 34c and 34d each of thickness about 1000 to about 2000 angstroms aligned upon the corresponding patterned thermal silicon oxide pad oxide layers 32a, 32b, 32c and 32d.

There is also shown within FIG. 9 formed within a series of trenches including the pair of narrow trenches 33a and 33b, and the wide trench 33c a series of thermal silicon oxide trench liner layers 36a, 36b, 36c, 36d and 36e formed, similarly with the patterned thermal silicon oxide pad oxide layers 32a, 32b, 32c and 32d, while employing a thermal oxidation method at a temperature of from about 800 to about 1000 degrees centigrade to form each thermal silicon oxide trench liner layer 36a, 36b, 36c, 36d or 36e of thickness about 150 to about 300 angstroms lining the series of trenches including the pair of narrow trenches 33a and 33b and the wide trench 33c.

As is shown within FIG. 9, each of the patterned silicon nitride layers 34a, 34b and 34c has a width W1, each of the narrow trenches 33a and 33b has a width W2, the patterned silicon nitride layer 34d has a width W4, the wide trench has a width W3 and the series of mesas including the series of patterned silicon nitride layers 34a, 34b, 34c and 34d each has a height H, where the widths W1, W2, W3 and W4 and the height H are analogous or equivalent to the widths W1, W2, W3 and W4 and the height H for the corresponding mesas and trenches within the first preferred embodiment of the present invention as illustrated within the schematic cross-sectional diagram of FIG. 1.

There is shown within FIG. 9 a blanket first trench fill dielectric layer 38 formed over the silicon semiconductor substrate 30, including the series of patterned pad oxide layers 32a, 32b, 32c and 32d, the series of patterned silicon nitride layers 34a, 34b, 34c and 34d and the series of thermal silicon oxide trench liner layers 36a, 36b, 36c, 36d and 36e, and partially filling the narrow trenches 33a and 33b and the wide trench 33c. Within the second preferred embodiment of the present invention, the blanket first trench fill dielectric layer 38 is formed of a silicon oxide dielectric material formed employing a first high density plasma chemical vapor deposition (HDP-CVD) method, preferably employing silane as a silicon source material, oxygen as an oxidant source material and argon as a sputtering source material. Similarly, with the blanket first aperture fill layer 12 employed within the first preferred embodiment of the present invention, the blanket first trench fill dielectric layer 38 is formed with a first deposition rate:sputter rate ratio which provides optimal gap filling of the blanket first trench fill dielectric layer 38 and a blanket second trench fill dielectric layer formed upon the blanket first trench fill dielectric layer 38 while simultaneously attenuating substrate damage to the semiconductor integrated circuit microelectronics fabrication whose schematic cross-sectional diagram is illustrated in FIG. 9. Such substrate damage is typically, but not exclusively, sustained by the patterned silicon nitride layers 34a, 34b, 34c and 34d. Similarly with the first preferred embodiment of the present invention, the first high density plasma chemical vapor deposition (HDP-CVD) method preferably employs the first deposition rate:sputter rate ratio of from about 2:1 to about 4:1, more preferably from about 2.5:1 to about 3.5:1 and most preferably from about 2.75:1 to about 3.25:1.

Preferably, the first high density plasma chemical vapor deposition (HDP-CVD) method also employs when fabricating an eight inch diameter silicon semiconductor substrate 30: (1) a reactor chamber pressure of from about 2 to about 6 mtorr; (2) a radio frequency source power of from about 3000 to about 5000 watts at a source radio frequency of from about 300 to about 600 MHZ; (3) a bias sputtering power of from about 2500 to about 3500 watts; (4) a silane silicon source material flow rate of from about 60 to about 100 standard cubic centimeters per minute (sccm); (5) an oxygen oxidant flow rate of from about 250 to about 300 standard cubic centimeters per minute (sccm); and (6) an argon sputtering source material flow rate of from about 110 to about 150 standard cubic centimeters per minute (sccm). Preferably, the blanket first trench fill dielectric layer 38 is formed to a thickness of from about 2000 to about 4000 angstroms.

Finally, there is shown within FIG. 9 formed upon the blanket first trench fill dielectric layer 38 a blanket second trench fill dielectric layer 40. Similarly with the first preferred embodiment of the present invention, within the second preferred embodiment of the present invention, the blanket second trench fill dielectric layer 40 is formed employing methods and materials analogous or equivalent to the methods and materials employed in forming the blanket first trench fill dielectric layer 38, with the exception that the blanket second trench fill dielectric layer 40 is formed employing a second high density plasma chemical vapor deposition (HDP-CVD) method employing a second deposition rate:sputter rate ratio to provide a first thickness of the blanket second trench fill dielectric layer 40 over each of the patterned silicon nitride layers 34a, 34b and 34c with respect to the patterned silicon nitride layer 34d such that upon chemical mechanical polish (CMP) planarizing the blanket second trench fill dielectric layer 40 and the blanket first trench fill dielectric layer 38 to form a series of patterned planarized trench isolation regions, the series of patterned planarized trench isolation regions is formed with optimal uniformity and planarity and with attenuated substrate damage to the semiconductor integrated circuit microelectronics fabrication thus formed. Within the second preferred embodiment of the present invention, the blanket second trench fill dielectric layer 40 is preferably formed to a planarizing thickness of from a bout 2000 to about 4000 angstroms.

Within the second preferred embodiment of the present invention, it has been determined experimentally that the second high density plasma chemical vapor deposition (HDP-CVD) method preferably employs a second deposition rate:sputter rate ratio of from about 5:1 to about 7:1, more preferably from about 5.5:1 to about 6.5:1 and most preferably from about 5.75:1 to about 6.25:1. Thus, also similarly with the first preferred embodiment of the present invention, the first deposition rate:sputter rate ratio is lower than the second deposition rate:sputter rate ratio. The second high density plasma chemical vapor deposition (HDP-CVD) method preferably employs parameters as are otherwise equivalent to the first high density plasma chemical vapor deposition (HDP-CVD) method, with the exceptions that: (1) the bias sputtering power is lowered to a value of from about 1500 to about 2500 watts from an original value of from about 2500 to about 3500 watts; and (2) the silane flow rate is increased to a value of from about 100 to about 140 standard cubic centimeters per minute (sccm) from an original value of about 60 to about 100 standard cubic centimeters per minute (sccm). The first high density plasma chemical vapor deposition (HDP-CVD) method and the second high density plasma chemical vapor deposition (HDP-CVD) method are otherwise typically and preferably undertaken sequentially in-situ within a single high density plasma chemical vapor deposition (HDP-CVD) reactor chamber.

Figure 10:
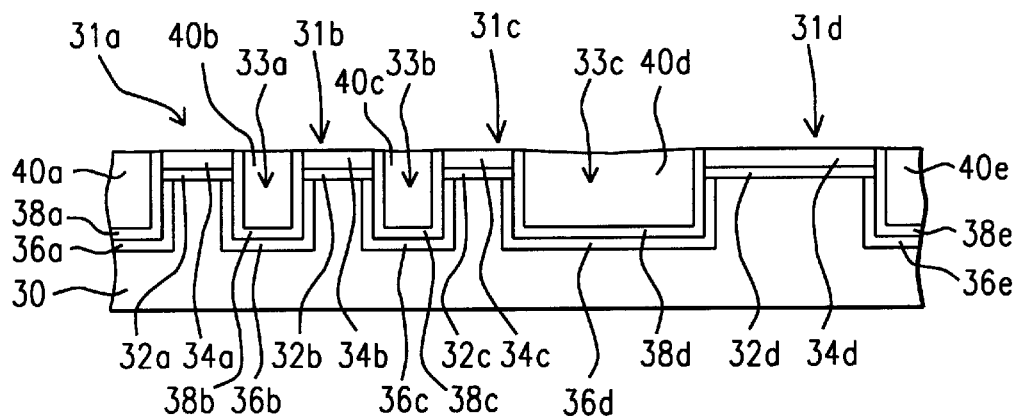

Referring now to FIG. 10, there is shown a schematic cross-sectional diagram illustrating the results of further processing of the semiconductor integrated circuit microelectronics fabrication whose schematic cross-sectional diagram is illustrated in FIG. 9. Shown in FIG. 10 is a schematic cross-sectional diagram of a semiconductor integrated circuit microelectronics fabrication otherwise equivalent to the semiconductor integrated circuit microelectronics fabrication whose schematic cross-sectional diagram is illustrated in FIG. 9, but wherein the blanket second trench fill dielectric layer 40 and the blanket first trench fill dielectric layer 38 have been chemical mechanical polish (CMP) planarized to form the patterned planarized second trench fill dielectric layers 40a, 40b, 40c, 40d and 40e and the patterned planarized first trench fill dielectric layers 38a, 38b, 38c, 38d and 38e which in the aggregate form a series of trench isolation regions within a series of isolation trenches within the silicon semiconductor substrate 30. The blanket second trench fill dielectric layer 40 and blanket first trench fill dielectric layer 38 are chemical mechanical polish (CMP) planarized to form the patterned planarized second trench fill dielectric layers 40a, 40b, 40c, 40d and 40e, and the patterned planarized first trench fill dielectric layers 38a, 38b, 38c, 38d and 38e employing chemical mechanical polish (CMP) planarizing methods as are conventional in the art of semiconductor integrated circuit microelectronics fabrication, which chemical mechanical polish (CMP) planarizing methods will typically and preferably employ an aqueous silica slurry.

Preferably, the chemical mechanical polish (CMP) planarizing methods also employ: (1) a platen pressure of from about 4 to about 7 pounds per square inch (psi); (2) a platen rotation speed of from about 20 to about 50 revolutions per minute (rpm); (3) a head counter-rotation speed of from about 20 to about 50 revolutions per minute (rpm); (4) a silicon semiconductor substrate 30 temperature of from about 20 to about 50 degrees centigrade; (5) an aqueous silica slurry concentration of about 10 to about 20 weight percent; and (6) an aqueous silica slurry flow rate of from about 100 to about 200 cubic centimeters per minute (ccm).

As is illustrated within the schematic cross-sectional diagram of FIG. 10, the patterned planarized second trench fill dielectric layers 40a, 40b, 40c, 40d and 40e, and the patterned planarized first trench fill dielectric layers 38a, 38b, 38c, 38d and 38e are formed with optimal uniformity and planarity without eroding the patterned silicon nitride layers 34a, 34b, 34c and 34d and thus damaging the substrate layers within the semiconductor integrated circuit microelectronics fabrication whose schematic cross-sectional diagram is illustrated in FIG. 10.

Figure 11:
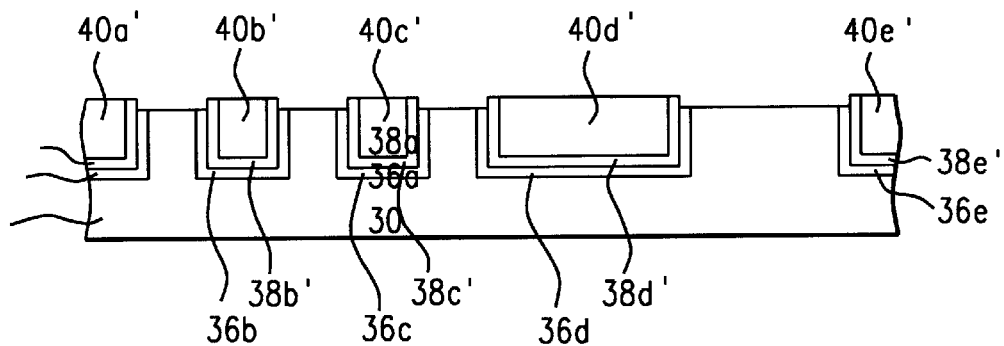

Referring now to FIG. 11, there is shown a schematic cross-sectional diagram illustrating the results of further processing of the semiconductor integrated circuit microelectronics fabrication whose schematic cross-sectional diagram is illustrated in FIG. 10. Shown in FIG. 11 is a schematic cross-sectional diagram of a semiconductor integrated circuit microelectronics fabrication otherwise equivalent to the semiconductor integrated circuit microelectronics fabrication whose schematic cross-sectional diagram is illustrated in FIG. 10, but wherein: (1) there has been stripped from the semiconductor integrated circuit microelectronics fabrication the patterned silicon nitride layers 34a, 34b, 34c and 34d; (2) and there is subsequently stripped from the semiconductor integrated circuit microelectronics fabrication the patterned thermal silicon oxide pad oxide layers 32a, 32b, 32c and 32d while simultaneously slightly etching back the patterned planarized second trench fill dielectric layers 40a, 40b, 40c, 40d and 40e and the patterned planarized first trench fill dielectric layers 38a, 38b, 38c, 38d and 38e to form the etched patterned planarized second trench fill dielectric layers 40a', 40b', 40c', 40d', and 40e' and the etched patterned planarized first trench fill dielectric layers 38a', 38b', 38c', 38d', and 38e'.

As is understood by a person skilled in the art, the patterned silicon nitride layers 34a, 34b, 34c and 34d are typically and preferably stripped from the integrated circuit microelectronics fabrication whose schematic cross-sectional diagram is illustrated in FIG. 10 to provide in part the integrated circuit microelectronics fabrication whose schematic cross-sectional diagram is illustrated in FIG. 11 employing etch methods as are convention in the art of integrated circuit microelectronics fabrication, which etch methods will typically include wet chemical etch methods employing refluxing phosphoric acid. As is similarly understood by a person skilled in the art, the patterned thermal silicon oxide pad oxide layers 32a, 32b, 32c and 32d are similarly stripped from the microelectronics fabrication whose schematic cross-sectional diagram is illustrated in FIG. 10 to provide in part the microelectronics fabrication whose schematic cross-sectional diagram is illustrated in FIG. 11 while simultaneously partially etching the patterned planarized second trench fill dielectric layers 40a, 40b, 40c, 40d and 40e and the patterned planarized first trench fill dielectric layers 38a, 38b, 38c, 38d and 38e while similarly employing etch methods as are conventional in the art of microelectronics fabrication, which etch methods will typically, but not exclusively, include wet chemical etch methods employing aqueous hydrofluoric acid solutions.

As is also understood by a person skilled in the art, although not specifically illustrated within the schematic cross-sectional diagrams of FIG. 9 to FIG. 11, there may be employed within the second preferred embodiment of the present invention, similarly with the first preferred embodiment of the present invention, an optional patterned photoresist layer etchback of the blanket second trench fill dielectric layer 40 and the blanket first trench fill dielectric layer 38 prior to chemical mechanical polish (CMP) planarizing those layers. Similarly also in concert with the first preferred embodiment of the present invention, the blanket first trench fill dielectric layer employed within the second preferred embodiment is optional within the second preferred embodiment of the present invention.

Figure 12:
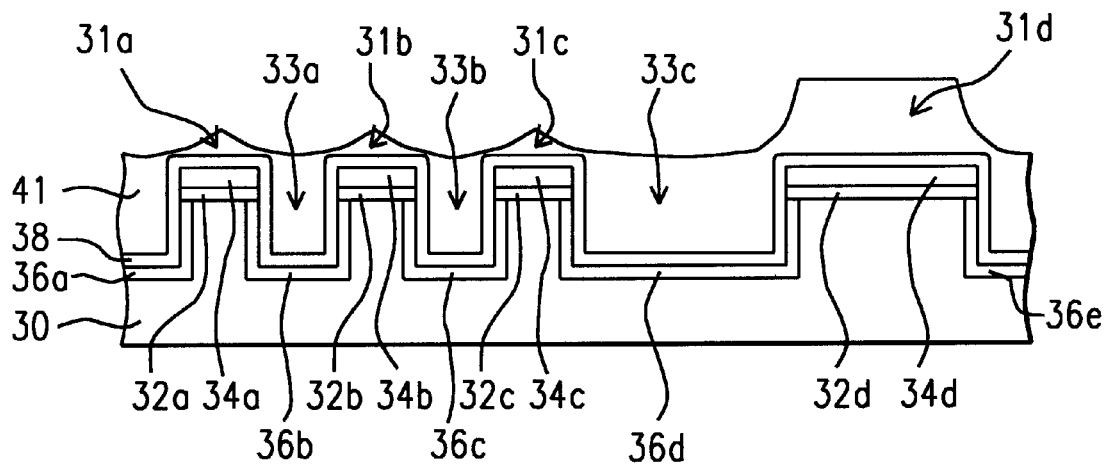

Referring now to FIG. 12 to FIG. 16, there is shown a series of schematic cross-sectional diagrams illustrating the results of forming in accord with an alternate more specific embodiment of the present invention which comprises an alternate second preferred embodiment of the present invention a series of patterned planarized trench isolation regions within a series of isolation trenches within a silicon semiconductor substrate within an integrated circuit microelectronics fabrication while employing the method of the present invention. Shown in FIG. 12 is a schematic cross-sectional diagram of the integrated circuit microelectronics fabrication at an early stage in its fabrication in accord with the second preferred embodiment of the present invention.

Shown in FIG. 12 is a schematic cross-sectional diagram of an integrated circuit microelectronics fabrication otherwise equivalent to the integrated circuit microelectronic fabrication whose schematic cross-sectional diagram is illustrated in FIG. 9, but wherein in place of the blanket second trench fill dielectric layer 40 there is formed the blanket second trench fill dielectric layer 41. Analogously with the difference within the first preferred embodiment of the present invention and the alternate first preferred embodiment of the present invention between the blanket second aperture fill layer 14 and the blanket second aperture fill layer 15, the blanket second trench fill dielectric layer 41 within the alternate second preferred embodiment of the present invention has a lower deposition rate:sputter rate ratio in comparison with the blanket first trench fill dielectric layer 38 than does the blanket second trench fill dielectric layer 40 within the second preferred embodiment of the present invention in comparison with the blanket first trench fill dielectric layer.

Figure 13:
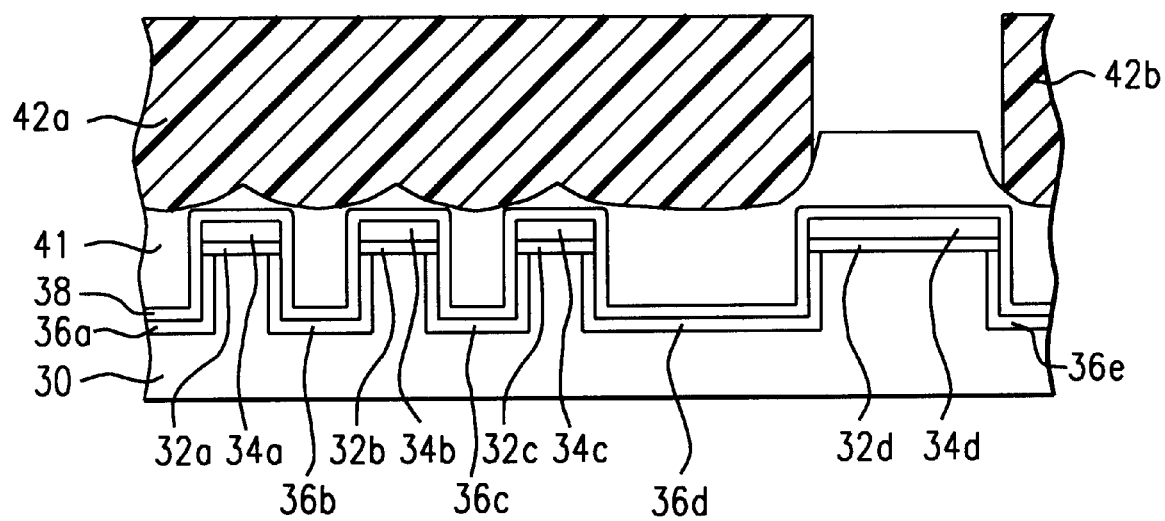

Referring now to FIG. 13, there is shown a schematic cross-sectional diagram illustrating the results of further processing of the integrated circuit microelectronics fabrication whose schematic cross-sectional diagram is illustrated in FIG. 12. Shown in FIG. 13 is a schematic cross-sectional diagram of an integrated circuit microelectronics fabrication otherwise equivalent to the integrated circuit microelectronics fabrication whose schematic cross-sectional diagram is illustrated within FIG. 12, but wherein there is formed upon the blanket second trench fill dielectric layer 41 a pair of patterned photoresist layers 42a and 42b which leave exposed a portion of the blanket second trench fill dielectric layer 41 over the wide mesa 31d while completely covering a portion of the blanket second trench fill dielectric layer 41 over the series of narrow mesas 31a, 31b and 31c. Methods and materials which may be employed to form the integrated circuit microelectronics fabrication whose schematic cross-sectional diagram is illustrated in FIG. 13 from the integrated circuit microelectronics fabrication whose schematic cross-sectional diagram is illustrated in FIG. 12 within the alternate second preferred embodiment of the present invention are analogous or equivalent to the methods and materials which may be employed to form the microelectronics fabrication whose schematic cross-sectional diagram is illustrated in FIG. 6 from the microelectronics fabrication whose schematic cross-sectional diagram is illustrated within FIG. 5 within the alternate first preferred embodiment of the present invention.

Figure 14:
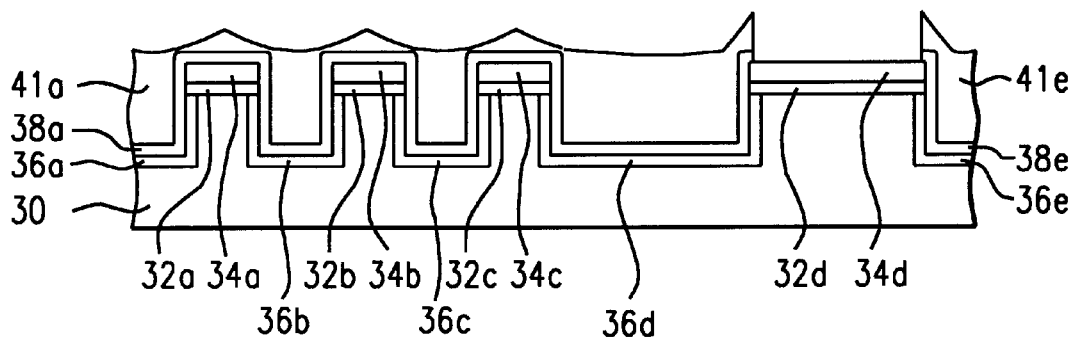

Referring now to FIG. 14, there is shown a schematic cross-sectional diagram illustrating the results of further processing of the integrated circuit microelectronics fabrication whose schematic cross-sectional diagram is illustrated in FIG. 13. Shown in FIG. 14 is a schematic cross-sectional diagram of an integrated circuit microelectronics fabrication otherwise equivalent to the integrated circuit microelectronics fabrication whose schematic cross-sectional diagram is illustrated in FIG. 13, but wherein: (1) the blanket second trench fill dielectric layer 41 and the blanket first trench fill dielectric layer 38 have been patterned to form the corresponding patterned second trench fill dielectric layers 41a and 41e and the corresponding patterned first trench fill dielectric layers 38a and 38e; and (2) the patterned photoresist layers 42a and 42d have been stripped from the integrated circuit microelectronics fabrication.

Figure 15:
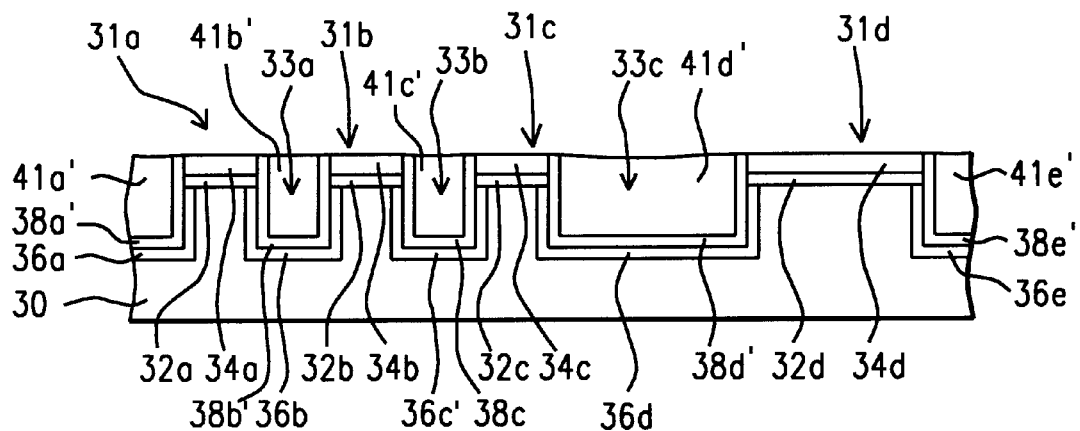

Methods and materials through which the integrated circuit microelectronics fabrication whose schematic cross-sectional diagram is illustrated within FIG. 15 may be formed from the integrated circuit microelectronics fabrication whose schematic cross-sectional diagram is illustrated in FIG. 14 within the alternate second preferred embodiment of the present invention are analogous or equivalent to methods and materials through which the microelectronics fabrication whose schematic cross-sectional diagram is illustrated in FIG. 7 may be formed from the microelectronics fabrication whose schematic cross-sectional diagram is illustrated in FIG. 6 within the alternate first preferred embodiment of the present invention, with the exception within the alternate second preferred embodiment of the present invention that the blanket second trench fill dielectric layer 41 and the blanket first trench fill dielectric layer 38 are preferably etched employing an anisotropic etchant employing a fluorocarbon etchant gas composition.

Figure 16:
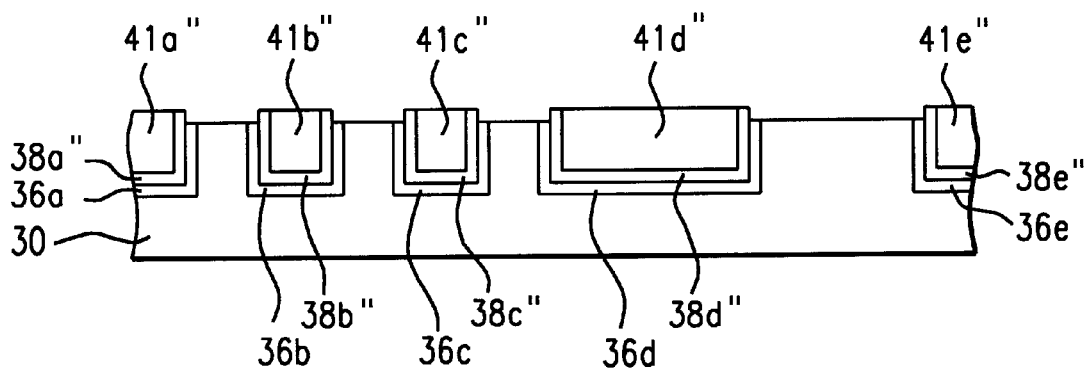

Referring now to FIG. 15 and FIG. 16, there is shown a pair of schematic cross-sectional diagrams illustrating the results of further processing of the integrated circuit microelectronics fabrication whose schematic cross-sectional diagram is illustrated in FIG. 14. Within the alternate second preferred embodiment of the present invention, the integrated circuit microelectronics fabrications whose schematic cross-sectional diagrams are illustrated in FIG. 15 and FIG. 16 are formed analogously with the integrated circuit microelectronics fabrications whose schematic cross-sectional diagrams are illustrated within FIG. 10 and FIG. 11, with the exception that there is replaced within FIG. 15 in comparison with FIG. 10: (1) a series of patterned planarized second trench fill dielectric layers 41a', 41b', 41c',41d' and 41e' for the series of patterned planarized trench fill dielectric layers 40a, 40b, 40c, 40d and 40e; and (2) a series of patterned planarized first trench fill dielectric layers 38a', 38b', 38c', 38d' and 38e' for the series of patterned planarized first trench fill dielectric layers 38a, 38b, 38c, 38d and 38e. Similarly, there is replaced within the integrated circuit microelectronics fabrication whose schematic cross-sectional diagram is illustrated in FIG. 16 in comparison with the integrated circuit microelectronics fabrication whose schematic cross-sectional diagram is illustrated in FIG. 11: (1) a series of etched patterned planarized second trench fill dielectric layers 41a", 41b", 41c", 41d" and 41e" for the series of etched patterned planarized second trench fill dielectric layers 40a', 40b', 40c', 40d' and 40e'; and (2) a series of etched patterned planarized first trench fill dielectric layers 38a", 38b", 38c", 38d" and 38e" for the series of etched patterned planarized first trench fill dielectric layers 38a', 38b', 38c', 38d' and 38e'.

Similarly with the foregoing embodiments of the present invention, within the alternate second preferred embodiment of the present invention, the patterned planarized isolation regions derived from the series of etched patterned planarized first dielectric layers 38a", 38b", 38c", 38d" and 38e" and the etched patterned planarized second dielectric layers 41a", 41b", 41c", 41d" and 41e" within the isolation trenches within the silicon semiconductor substrate 30 are formed with optimal uniformity and planarity and attenuated substrate damage due to a selection of a deposition rate:sputter rate ratio for a pair of blanket trench fill dielectric layers employed when forming the patterned planarized isolation regions.

As is understood by a person skilled in the art, the preferred embodiments of the present invention are illustrative of the present invention rather than limiting of the present invention. Revisions and modifications may be made to methods, materials, structures and dimensions through which is formed a microelectronics fabrication or a semiconductor integrated circuit microelectronics fabrication in accord with the preferred embodiments of the present invention, while still providing a microelectronics fabrication or a semiconductor integrated circuit microelectronics fabrication formed in accord with the present invention, as defined by the appended claims.

What is claimed is:

1. A method for forming a series of patterned planarized aperture fill layers within a series of apertures within a topographic substrate layer employed within a microelectronics fabrication comprising:

providing a topographic substrate layer employed within a microelectronics fabrication, the topographic substrate layer comprising a series of mesas of substantially equivalent height but of differing widths, the series of mesas being separated by a series of apertures;

forming upon the topographic substrate layer a blanket first aperture fill layer, the blanket first aperture fill layer being formed employing a first simultaneous deposition and sputter method, the blanket first aperture fill layer filling the series of apertures to a planarizing thickness at least as high as the height of the mesas while simultaneously forming a series of protrusions of the blanket first aperture fill layer corresponding with the series of mesas, where the thickness of a protrusion of the blanket first aperture fill layer over a narrow mesa is less than the thickness of a protrusion of the blanket first aperture fill layer over a wide mesa, and where the first simultaneous deposition and sputter method employs a first deposition rate:sputter rate ratio which provides sufficient thickness of the blanket first aperture fill layer over the narrow mesa such that upon chemical mechanical polish (CMP) planarizing the blanket first aperture fill layer to form a series of patterned planarized first aperture fill layers within the series of apertures erosion of the narrow mesa is attenuated;

forming a patterned photoresist layer upon the blanket first aperture fill layer, the patterned photoresist layer overlying the apertures leaving exposed the protrusions within the blanket fill aperture fill layer over at least the narrow and wide mesas;

etching at least partially the protrusions within the blanket first aperture fill layer over the mesas left exposed by the patterned photoresist layer; and chemical mechanical polish (CMP) planarizing the blanket first aperture fill layer to form the series of patterned planarized first aperture fill layers within the series of apertures.

2. The method of claim 1 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

3. The method of claim 1 wherein the topographic substrate layer is selected from the group consisting of topographic conductor substrate layers, topographic semiconductor substrate layers, topographic insulator substrate layers, and composites thereof.

4. The method of claim 1 wherein the blanket first aperture fill layer is formed from an aperture fill material selected from the group consisting of conductor aperture fill materials, semiconductor aperture fill materials and insulator aperture fill materials.

5. The method of claim 1 further comprising forming a blanket second aperture fill layer upon the topographic substrate layer prior to forming the first blanket aperture fill layer upon the topographic substrate layer, wherein:

the blanket first aperture fill layer is formed upon the blanket second aperture fill layer; and the blanket second aperture fill layer is formed employing a second simultaneous deposition and sputter method employing a second deposition rate:sputter rate ratio which attenuates erosion of the series of mesas when forming the blanket second aperture fill layer and the blanket first aperture fill layer.

6. The method of claim 5 wherein:

the first deposition rate:sputter rate ratio is higher than the second deposition rate:sputter rate ratio;

the first deposition rate:sputter rate ratio is from about 5:1 to about 7:1; and the second deposition rate:sputter rate ratio is from about 2:1 to about 4:1.

7. The method of claim 5 wherein:

the first deposition rate:sputter rate ratio is lower the second deposition rate:sputter rate ratio;

the first deposition rate:sputter rate ratio is from about 2:1 to about 4:1; and the second deposition rate:sputter rate ratio is from about 5:1 to about 7:1.

8. The method of claim 1, wherein the upper surface of the mesas further include a pad oxide layer, and a nitride layer overlying the pad oxide layer.

9. A method for forming a series of patterned planarized aperture fill layers within a series of apertures within a topographic substrate layer employed within a microelectronics fabrication comprising:

providing a topographic substrate layer employed within a microelectronics fabrication, the topographic substrate layer comprising a series of mesas of substantially equivalent height but of differing widths, the series of mesas being separated by a series of apertures defined by a first patterned photoresist layer overlying at least the mesas;

forming upon the topographic substrate layer a blanket first aperture fill layer, the blanket first aperture fill layer being formed employing a first simultaneous deposition and sputter method, the blanket first aperture fill layer filling the series of apertures to a planarizing thickness at least as high as the height of the mesas while simultaneously forming a series of protrusions of the blanket first aperture fill layer corresponding with the series of mesas, where the thickness of a protrusion of the blanket first aperture fill layer over a narrow mesa is less than the thickness of a protrusion of the blanket first aperture fill layer over a wide mesa, and where the first simultaneous deposition and sputter method employs a first deposition rate: sputter rate ratio which provides sufficient thickness of the blanket first aperture fill layer over the narrow mesa such that upon chemical mechanical polish (CMP) planarizing the blanket first aperture fill layer to form a series of patterned planarized first aperture fill layers within the series of apertures erosion of the narrow mesa is attenuated;

exposing, developing and exposing a second photoresist layer to form a patterned second photoresist layer upon the blanket first aperture fill layer, the patterned second photoresist layer overlying at least the apertures leaving exposed the protrusion within the blanket fill aperture fill layer over the mesas;

etching at least partially the protrusion within the blanket first aperture fill layer over the mesas left exposed by the patterned second photoresist layer; and chemical mechanical polish (CMP) planarizing the blanket first aperture fill layer to form the series of patterned planarized first aperture fill layers within the series of apertures.

10. The method of claim 9 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

11. The method of claim 9 wherein the topographic substrate layer is selected from the group consisting of topographic conductor substrate layers, topographic semiconductor substrate layers, topographic insulator substrate layers, and composites thereof.

12. The method of claim 9 wherein the blanket first aperture fill layer is formed from an aperture fill material selected from the group consisting of conductor aperture fill materials, semiconductor aperture fill materials and insulator aperture fill materials.

13. The method of claim 9 further comprising forming a blanket second aperture fill layer upon the topographic substrate layer prior to forming the first blanket aperture fill layer upon the topographic substrate layer, wherein:

the blanket first aperture fill layer is formed upon the blanket second aperture fill layer; and the blanket second aperture fill layer is formed employing a second simultaneous deposition and sputter method employing a second deposition rate:sputter rate ratio which attenuates erosion of the series of mesas when forming the blanket second aperture fill layer and the blanket first aperture fill layer.

14. The method of claim 13 wherein:

the first deposition rate:sputter rate ratio is higher than the second deposition rate:sputter rate ratio;

the first deposition rate:sputter rate ratio is from about 5:1 to about 7:1; and the second deposition rate:sputter rate ratio is from about 2:1 to about 4:1.

15. The method of claim 9 wherein:

the first deposition rate:sputter rate ratio is lower the second deposition rate:sputter rate ratio;

the first deposition rate:sputter rate ratio is from about 2:1 to about 4:1; and the second deposition rate:sputter rate ratio is from about 5:1 to about 7:1.

16. The method of claim 9, wherein the upper surface of the mesas further include a pad oxide layer, and a nitride layer overlying the pad oxide layer.

17. A method for forming a series of patterned planarized aperture fill layers within a series of apertures within a topographic substrate layer employed within a microelectronics fabrication comprising:

providing a topographic substrate layer employed within a microelectronics fabrication, the topographic substrate layer comprising a series of mesas of substantially equivalent height but of differing widths, the series of mesas being separated by a series of apertures defined by a first patterned photoresist layer overlying at least the mesas;

forming upon the topographic substrate layer a blanket first aperture fill layer, the blanket first aperture fill layer being formed employing a first simultaneous deposition and sputter method, the blanket first aperture fill layer filling the series of apertures to a planarizing thickness at least as high as the height of the mesas while simultaneously forming a series of protrusions of the blanket first aperture fill layer corresponding with the series of mesas, where the thickness of a protrusion of the blanket first aperture fill layer over a narrow mesa is less than the thickness of a protrusion of the blanket first aperture fill layer over a wide mesa, and where the first simultaneous deposition and sputter method employs a first deposition rate:sputter rate ratio which provides sufficient thickness of the blanket first aperture fill layer over the narrow mesa such that upon chemical mechanical polish (CMP) planarizing the blanket first aperture fill layer to form a series of patterned planarized first aperture fill layers within the series of apertures erosion of the narrow mesa is attenuated;

exposing and developing a second photoresist layer to form a patterned second photoresist layer upon the blanket first aperture fill layer, the patterned second photoresist layer overlying at least the apertures leaving exposed the protrusion within the blanket fill aperture fill layer over only the wide mesas;

etching at least partially the protrusion within the blanket first aperture fill layer over the wide mesas left exposed by the patterned second photoresist layer; and chemical mechanical polish (CMP) planarizing the blanket first aperture fill layer to form the series of patterned planarized first aperture fill layers within the series of apertures.

18. The method of claim 17, wherein the microelectronics fabrication is selected from the group consisting of semiconductor integrated circuit microelectronics fabrication, solar cell microelectronics fabrication, ceramic substrate microelectronics fabrications and flat panel display microelectronics fabrications.

19. The method of claim 17, wherein the topographic substrate layer is selected from the group consisting of topographic conductor substrate layers, topographic semiconductor substrate layers, topographic insulator substrate layers, and composites thereof.

20. The method of claim 17, wherein the blanket first aperture fill layer is formed from an aperture fill material selected from the group consisting of conductor aperture fill materials, semiconductor aperture fill materials and insulator aperture fill materials.

21. The method of claim 17, further comprising forming a blanket second aperture fill layer upon the topographic substrate layer prior to forming the first blanket aperture fill layer upon the topographic substrate layer, wherein:

the blanket first aperture fill layer is formed upon the blanket second aperture fill layer; and the blanket second aperture fill layer is formed employing a second simultaneous deposition and sputter method employing a second deposition rate:sputter rate ratio which attenuates erosion of the series of mesa when forming the blanket second aperture fill layer and the blanket first aperture fill layer.

22. The method of claim 21, wherein:

the first deposition rate:sputter rate ratio is higher than the second deposition rate:sputter rate ratio;

the first deposition rate:sputter rate ratio is from about 5:1 to about 7:1; and the second deposition rate:sputter rate ratio is from about 2:1 to about 4:1.

23. The method of claim 17, wherein:

the first deposition rate:sputter rate ratio is lower the second deposition rate:sputter rate ratio;

the first deposition rate:sputter rate ratio is from about 2:1 to about 4:1; and the second deposition rate:sputter rate ratio is from about 5:1 to about 7:1.

24. The method of claim 17, wherein the upper surface of the mesas further include a pad oxide layer, and a nitride layer overlying the pad oxide layer.

* * * * *